(12) United States Patent
Sharma et al.

(10) Patent No.: US 6,885,573 B2
(45) Date of Patent: Apr. 26, 2005

(54) DIODE FOR USE IN MRAM DEVICES AND METHOD OF MANUFACTURE

(75) Inventors: Manish Sharma, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/098,206

(22) Filed: Mar. 15, 2002

(65) Prior Publication Data

US 2003/0185038 A1 Oct. 2, 2003

(51) Int. Cl.⁷ .............................................. G11C 17/06
(52) U.S. Cl. ...................... 365/105; 365/158; 365/175
(58) Field of Search ................................ 365/100, 105, 365/115, 158, 171, 175, 189.07, 206, 207, 173

(56) References Cited

U.S. PATENT DOCUMENTS

| | | | |
|---|---|---|---|
| 5,640,343 A | | 6/1997 | Gallagher et al. |
| 5,793,697 A | | 8/1998 | Scheuerlein |
| 5,831,920 A | * | 11/1998 | Chen et al. ............. 365/225.5 |
| 5,991,193 A | | 11/1999 | Gallagher et al. |
| 6,034,882 A | * | 3/2000 | Johnson et al. ............. 365/103 |
| 6,081,446 A | | 6/2000 | Brug et al. |
| 6,130,835 A | | 10/2000 | Scheuerlein |
| 6,169,686 B1 | | 1/2001 | Brug et al. |
| 6,256,247 B1 | | 7/2001 | Perner |
| 6,259,644 B1 | | 7/2001 | Tran et al. |
| 6,297,987 B1 | | 10/2001 | Johnson et al. |
| 6,341,084 B1 | * | 1/2002 | Numata et al. ............. 365/158 |
| 6,456,524 B1 | * | 9/2002 | Perner et al. ............. 365/158 |
| 6,462,981 B1 | * | 10/2002 | Numata et al. ............. 365/158 |
| 6,462,982 B1 | * | 10/2002 | Numata et al. ............. 365/158 |
| 6,504,752 B1 | * | 1/2003 | Ito ............................. 365/158 |
| 6,522,594 B1 | * | 2/2003 | Scheuerlein ............. 365/206 |
| 2002/0003721 A1 | | 1/2002 | Brug et al. |
| 2003/0116847 A1 | | 6/2003 | Kim |

FOREIGN PATENT DOCUMENTS

EP          1096500 A          5/2001

* cited by examiner

Primary Examiner—Gene N. Auduong

(57) ABSTRACT

A data storage device is disclosed that has a plurality of word lines, a plurality of bit lines, and a resistive crosspoint array of memory cells. Each memory cell is connected to a bit line and connected to an isolation diode that further connects to a respective word line. The isolation diode provides a unidirectional conductive path from the bit line to the word line. Each word line provides a common metal-semiconductor contact with each diode sharing the word line such that each diode has a separate metal contact located between the semiconductor portion of the common metal-semiconductor contact and its respective memory cell.

20 Claims, 6 Drawing Sheets

DIODE FOR USE IN MRAM DEVICES AND METHOD OF MANUFACTURE

BACKGROUND OF THE INVENTION

The present invention relates generally to random access memory for data storage. More specifically, the present invention relates to a magnetic random access memory device that includes improved unidirectional elements to limit leakage current within the array.

Magnetic random access memory ("MRAM") is a nonvolatile memory that shows considerable promise for long-term data storage. Performing read and write operations on MRAM devices are much faster than performing read and write operations on conventional memory devices such as DRAM and Flash and order of magnitude faster than long-term storage devices such as hard drives. In addition, the MRAM devices are more compact and consume less power than other conventional storage devices.

A typical MRAM device includes an array of memory cells. Word lines extend across rows of the memory cells and bit lines extend along columns of the memory cells. Each memory cell is located at a crosspoint of the word line and a bit line.

A memory cell stores a bit of information as an orientation of a magnetization. The magnetization of each memory cells assumes one of two stable orientations at any given time. These two stable orientations, parallel and anti-parallel, represent logic values of "0" and "1".

The magnetization orientation affects the resistance of a memory cell such as a spin-tunneling device. For instance, resistance of a memory cell is a first value R if the magnetization orientation is parallel and resistance of the memory cell is increased to a second value $R+\Delta R$ if the magnetization orientation is changed from parallel to anti-parallel. The magnetization orientation of a selected memory cell and, therefore, the logic state of the memory cell may be read by sensing the resistance state of the memory cell. The memory cells thus form a memory array of resistive crosspoints.

Applying a voltage to a selected memory cell and measuring a sense current that flows through the memory cell one may sense the resistance state. Ideally, the resistance would be proportional to the sense current.

Sensing the resistance state of a single memory cell in an array, however, can be unreliable. All memory cells in the array are coupled together through many parallel paths. The resistance seen at one crosspoint equals the resistance of the memory cell at that crosspoint in parallel with resistances of memory cells in the other rows and columns of the array.

Moreover, if the memory cell being sensed has a different resistance due to the stored magnetization, a small differential voltage may develop. This small differential voltage can give rise to a parasitic or "sneak path" current, which is also known as a leakage current. The parasitic or leakage current becomes large in a large array and, therefore, can obscure the sense current. Consequently, the parasitic current can prevent the resistance from being sensed.

Unreliability in sensing the resistance state is compounded by manufacturing variations, variations in operating temperatures, and aging of the MRAM devices. These factors can cause the average value of resistance in the memory cell to vary.

The prior art has attempted to reduce, if not actually eliminate leakage current through various designs. One approach involves adding a unidirectional element, such as a diode, to limit the current path in one direction. FIG. 1 illustrates such an embodiment. The memory cell 4 includes a diode 6 to limit current flow in the direction dictated by the diode 6. When a sense current is applied as shown in FIG. 1, the current actually measured by the sense amplifier is the sense current I_s flowing through the intended cell 4, and the leakage current I_leak, which flows through several other memory cell/diode pairs. This additional leakage current reduces the operating range of the sense amplifier. Further, as the size of the memory array increases, the leakage current dominates the sense signal, reducing even more the operating range of the sense amplifier. Additionally, noise increases in the sensing amplifier because of the leakage current paths.

Accordingly, there is a need to be able to reduce, if not eliminate, leakage current that exists when diodes are utilized. What is further needed is a method of manufacturing an MRAM device having such diodes that reduces costs and improves performance by reducing or eliminating leakage current through the diodes within the device.

SUMMARY OF THE INVENTION

According to the present invention, a data storage device is disclosed that has a plurality of word lines, a plurality of bit lines, and a resistive cross-point array of memory cells. Each memory cell is connected to a bit line and connected to an isolation diode that further connects to a respective word line. The isolation diode provides a unidirectional conductive path from the bit line to the word line. Each word line provides a common metal-semiconductor contact with each diode sharing the word line such that each diode has a separate metal contact located between the semiconductor portion of the common metal-semiconductor contact and its respective memory cell.

BRIEF DESCRIPTION OF THE DRAWINGS

FIG. 4b is a cross-sectional view AA that illustrates patterning of the material shown in FIG. 3a.

DETAILED DESCRIPTION

Figure 1:
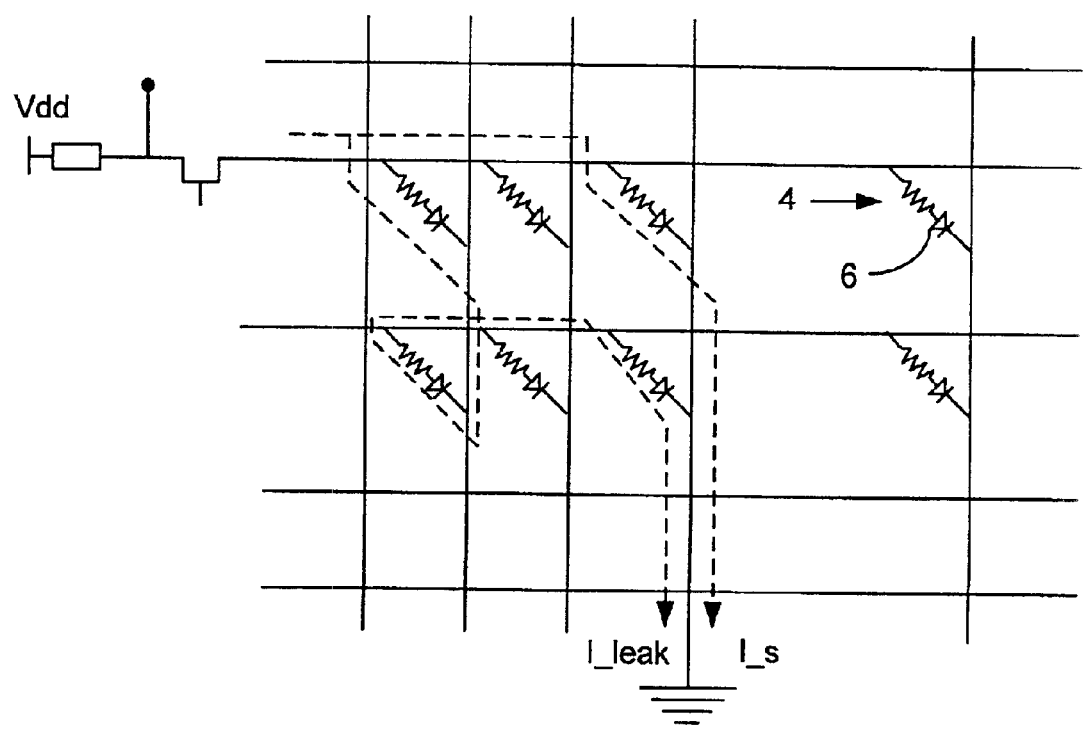
FIG. 1 depicts a prior art schematic diagram of a sense operation on a selected memory cell and how leakage current affects the sense current.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As shown in the drawings for purposes of illustration, the present invention is embodied in a magnetic random access memory device. The MRAM device includes an array of memory cells and a read-write circuit for reading or writing data from the memory cells. The read circuit, which includes equipotential application devices and differential sensing amplifiers, can reliably sense different resistance states of selected memory cells within the array. The write circuit can selectively switch individual bits in the array from one memory state to another.

Figure 2:
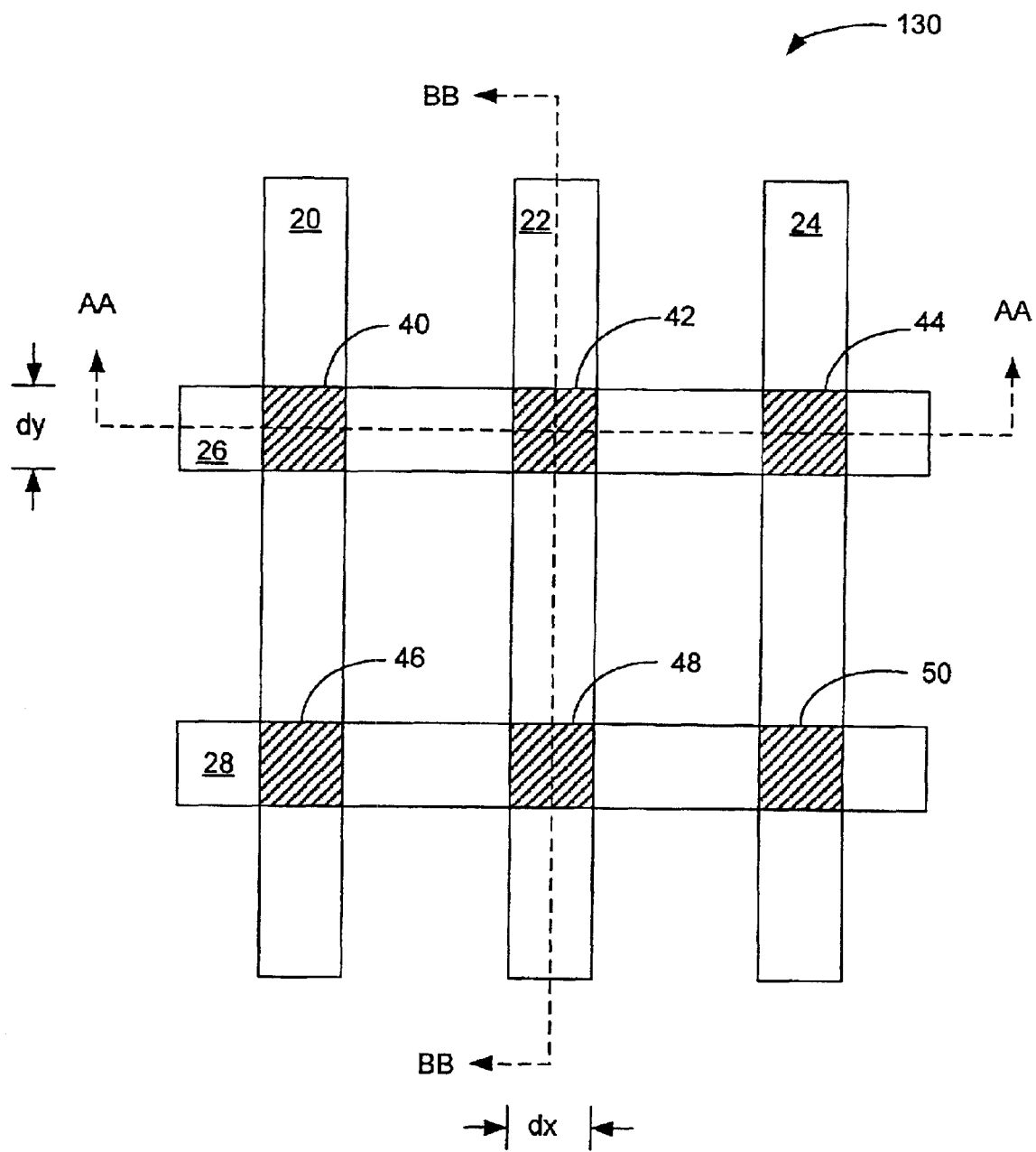
FIG. 2 is a top view of a solid-state memory that includes an array of magnetic storage cells and an array of conductors that enable read and write access to the magnetic storage cells.

FIG. 2 is a top view of a solid-state memory 130, which includes an array of magnetic storage cells 40–50. The solid-state memory 130 also includes an array of conductors 20–28 that enable read and write access to the magnetic storage cells 40–50. The magnetic storage cells 40–50 use magnetic fields to store information. Each of the magnetic storage cells 40–50 enables storage of a corresponding bit of information which may be referred to as a data bit.

The magnetic storage cells 40–50 and the conductors 20–28 are formed onto a substrate 10. The conductors 20–28 are arranged as a set of top conductors 26–28 and an orthogonal set of bottom conductors 20–24. Each of the magnetic storage cells 40–50 has rectangular dimensions $d_x$ and $d_y$ which are defined by the widths of the bottom conductors 20–24 and the widths of the top conductors 26–28, respectively.

Figure 3A:
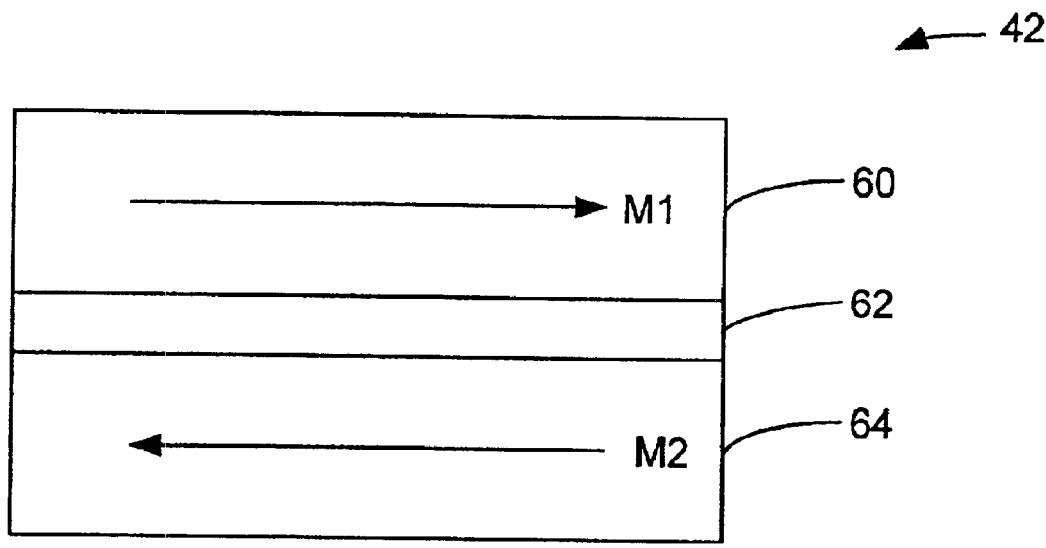
FIGS. 3a–3b illustrate the storage of a data bit in a magnetic storage cell.
Figure 3B:
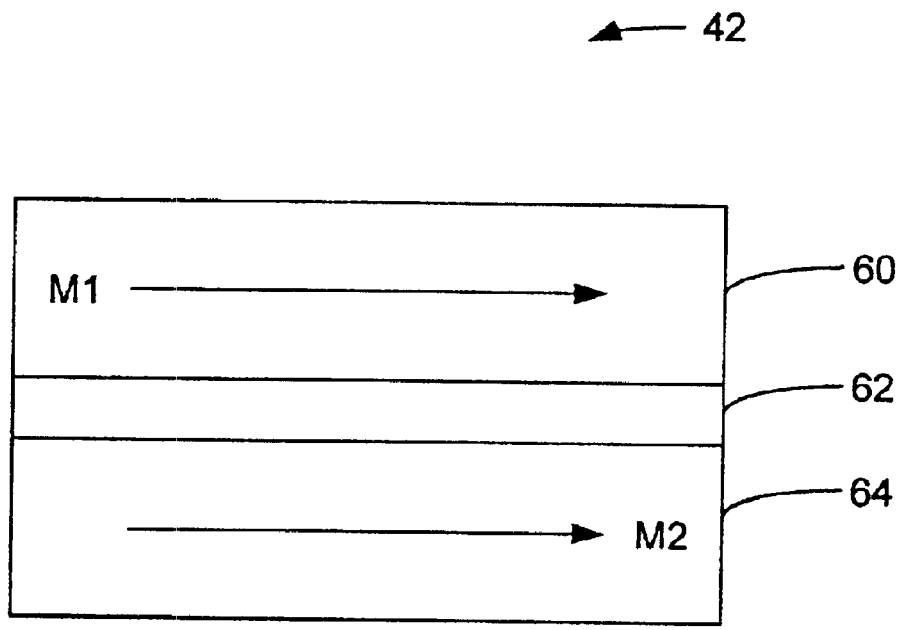

FIGS. 3a–3b illustrates the storage of a data bit in the magnetic storage cell 42. The magnetic storage cell 42 includes a magnetic film 60 and a magnetic film 64 which are separated by a dielectric region 62. The structure and the functionality of the remaining storage cells 40–50 are substantially similar to that of the magnetic storage cell 42. The orientation of magnetization in the magnetic film 60 is shown as M1 and the orientation of magnetization in the magnetic film 64 is shown as M2.

One of the magnetic films 60 and 64 has a fixed orientation of magnetization and serves as a reference layer while the other has a non-fixed orientation of magnetization. The magnetic film 60 or 64 having a non-fixed orientation of magnetization is the active magnetic film of the magnetic storage cell 42, also referred to as the data layer. The data layer rotates its orientation of magnetization in response to electrical signals applied to the conductors 22 and 26 during write operations to the magnetic storage cell 42. In one embodiment, a first logic state of the data bit stored in the magnetic storage cell 42 is indicated when M1 and M2 are parallel and a second logic state is indicated when M1 and M2 are anti-parallel.

In different embodiments, other arrangements of magnetic orientations may be employed for storing information in the magnetic storage cell 42. Two different MRAM cell structures are possible. One structure has the reference layer placed on the top of the stack and forms a top spin-valve structure. Another structure has the reference layer placed on the bottom of the stack and forms a bottom spin-valve structure. The reference layer can be made out of either a soft reference layer structure or a pinned FM layer structure. When the reference layer is formed of a soft magnetic material, the soft reference layer needs to be set by applying a current during operation. When the reference material is formed of a ferromagnetic (FM) material layer with its magnetic field pinned in a certain direction due to the presence of an adjacent anti-ferromagnetic (AFM) material layer, the pinned FM layer is set once during manufacturing and remains that way permanently for the life of the cell. The function of the soft reference layer is the same as that of the pinned FM layer. Especially with respect to the formation of MTJ-diode structure.

In one embodiment, the magnetic film 64 is pinned with a fixed orientation of magnetization M2 while the magnetic film 60 has non-fixed orientation of magnetization M1. The orientation of magnetization M1 in the magnetic film 60 changes in response to electrical signals applied to the conductors 22 and 26 during write operations to the magnetic storage cell 42.

FIG. 3a illustrates a "0" logic state of a data bit stored in the magnetic storage cell 42. In the "0" logic state the orientation of magnetization in the magnetic film 60 (M1) is antiparallel to the orientation of magnetization M2 in the magnetic film 64. FIG. 3b shows a "1" logic state for magnetic storage cell 42. In the "1" logic state, M1 is parallel to M2. The state of the cell may be reversed such that the antiparallel orientation is a "1" logic state and the parallel state is a "0" logic state. Other variations are possible and need not be limited to the state definitions given.

The magnetic storage cell 42 is read by applying a voltage potential, which may be referred to as a read voltage, across the conductors 26 and 22. The read voltage causes an electrical current, also known as a sense current, to flow between the magnetic films 60–64 as electrical charge migrates through the dielectric region 62 according to a phenomenon known as spin tunneling. The storage cell 42 may be referred to as a spin tunneling storage cell.

The resistance of the magnetic storage cell 42 differs according to the orientations of M1 and M2. When M1 and M2 are antiparallel, the "0" logic state, the resistance of the magnetic storage cell 42 is at its highest. On the other hand, the resistance of the magnetic storage cell 42 is at its lowest when M1 and M2 are parallel which corresponds to the "1" logic state. As a consequence, the logic state of the data bit stored in the magnetic storage cell 42 can be determined by measuring its resistance. The resistance of the magnetic storage cell 42 is reflected by the magnitude of the sense current that flows in response to the read voltage applied to the conductors 22 and 26.

FIGS. 4a–4e illustrate the formation of the array of magnetic storage cells 40–50 and the conductors 20–28 on the substrate 10. Further, each magnetic storage cell 40–50 further includes a unidirectional conductor or diode that provides benefits not previously seen in the prior art. The diode is fabricated as a Schottky metal-semiconductor diode wherein the metal portion is preferably formed of Platinum (Pt) and the metal portion also serves as the conductors 20–24 or 26–28, depending upon the array design. In the prior art, p-n junctions have been implemented in MRAM devices. Further, it is believed that Schottky-metal semiconductor diodes have not been implemented in MRAM devices before the present invention.

In one embodiment, the substrate 10 is a silicon substrate that accommodates the formation of support electronics for the solid-state memory 130 such as sense amplifier and multiplexor circuitry. The process steps for the formation of the magnetic storage cells 40–50 and the conductors 20–28 does not require that the substrate 10 be a semiconductor material. Further, the order of the process steps may be reversed, depending upon the circuit design.

Figure 4A:
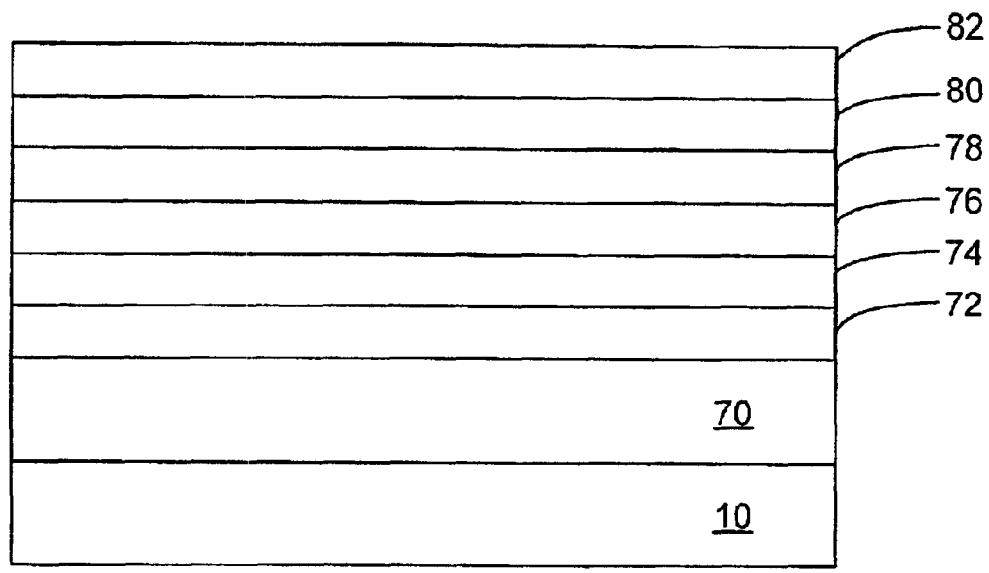
FIG. 4a is a cross-sectional view AA that shows a series of materials which are initially deposited onto a substrate and which are subsequently formed into conductors and magnetic storage cells.

FIG. 4a is a cross-sectional view AA, which shows a series of materials 70–78 that are initially deposited onto the substrate 10. A layer of conductor material 70 is deposited onto the substrate 10 and provides a layer of conductive material for the formation of the conductors 20–24 which are the bottom conductors for the solid-state memory 130. The conductor material 70 is a sheet of conductive material such as copper, aluminum, or gold, or alloys of these materials.

A semiconducting material 72 is deposited on the conductor material 70. The semiconducting material 72 provides a layer for forming the dielectric regions of the magnetic storage cells 40–50, such as the dielectric region 62 of the magnetic storage cell 42. In one embodiment, the semiconducting material 72 is amorphous silicon. Eventually, layer 72 forms part of the diode portion of the cell and not the magnetic tunnel junction portion. The desired result is that each memory cell in the array has a MTJ in series with a Schottky-metal (Pt-Si) diode.

A second layer of conductor material 74 is deposited onto the insulating material and serves as the Schottky metal for each diode associated with each cell 40–50. The conductor material 74 is a sheet of conductive material such as Pt. Other materials may be substituted and they include copper, aluminum, or gold, or alloys of these materials. Pt is typically utilized over other conductor metals as it provides better rectification than most others. The diode is formed by two layers, one of Pt and the other of n-doped silicon. After heat treatment, the Pt and Si at the interface react to form Pt-silicide. Other metal silicides are also contemplated, such as silicides of any of the substitutable metals previously mentioned.

After the formation of the diodes, the cells 40–50 are formed. In one embodiment, an antiferromagnetic material 76 is deposited on top of the conductor material 74. The antiferromagnetic material 76 provides a magnetic pinning material for fixing the orientations M2 in the magnetic storage cells 40–50 to be formed on the substrate 10. The antiferromagnetic material 76 may be iron-manganese (FeMn) or nickel-manganese (NiMn). Alternative materials for the antiferromagnetic material 76 include NiO and IrMn.

A magnetic film 78 is deposited on top of the antiferromagnetic material 76. The effect of magnetic exchange coupling between the magnetic film 78 and the antiferromagnetic material 76 pins the orientation of the magnetization in the magnetic film 78. The magnetic film 78 provides a layer of pinned magnetic material for forming the pinned magnetic film regions of the magnetic storage cells 40–50. For example, the magnetic film 78 is subsequently formed into the pinned magnetic film 64 of the magnetic storage cell 42. The magnetic film 78 may be nickel-iron (NiFe) or cobalt or alloys or layers comprised of combinations of these materials. Alternative materials for the magnetic film 78 include $Fe_3O_4$ and $CrO_2$ or other ferromagnetic or ferrimagnetic materials.

A layer of insulating material 80 is deposited on the magnetic film 78. The insulating material 80 provides a layer for forming the dielectric regions of the magnetic storage cells 40–50, such as the dielectric region 62 of the magnetic storage cell 42. In one embodiment, the insulating material 80 is aluminum-oxide ($Al_2O_3$). Alternative materials of the insulating material 80 include silicon-dioxide ($SiO_2$), tantalum-oxide ($Ta_2O_5$), and silicon-nitride ($Si_3N_4$).

A magnetic film 82 is deposited on top of the insulating material 80. The magnetic film 82 provides a layer of material for forming the active regions of the magnetic storage cells 40–50, such as the magnetic film 60 of the storage cell 42. The magnetic film 82 may be nickel-iron (NiFe) or cobalt or alloys or layers comprised of combinations of these materials.

Figure 4B:
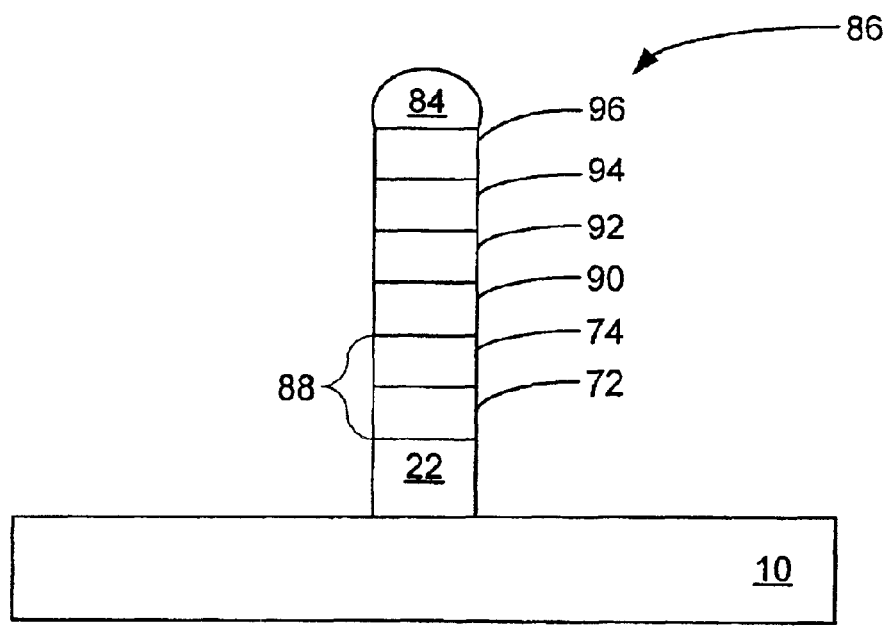

FIG. 4b is a cross-sectional view AA which illustrates a patterning of the material shown in FIG. 4a. The patterning is performed by forming lines of photo-resist, including the photo-resist 84, on top of the magnetic film 82 using photolithography. The line of photo-resist 84 defines the length of the bottom conductor 22 and the $d_x$ dimension of the bottom conductor 22 and the magnetic storage cells 42 and 48. An ion milling operation is performed to remove the materials from the substrate 10 that are not protected by photo-resist. The ion milling operation may be performed, for example, with a bombardment of argon ions. The protection provided by the photo-resist 84, for example, results in the formation of a stacked structure 86 from the materials shown in FIG. 4a. It should be noted that multiple steps of patterning is typically done in order to achieve the desired circuit arrangement. In this case, patterning is performed so that conductor material 70 and semiconducting material 72 are aligned with one another and semiconducting material 72 runs the length of conductor material 70, which forms bottom conductor 22 with the semiconductor portion 72 serving as part of the Schottky-metal diode. The surface is further patterned using well-known techniques to isolate a stack of second conductor material 74, antiferromagnetic material 76, magnetic film 78, insulating barrier 80 and second magnetic film 82.

The stacked structure 86 includes the bottom conductor 22, which is a remnant of the conductor material 70. The semiconducting material 72 serves as the rectifying portion of diode 88 as shown in the stack structure 86. The second conducting material 74 serves as the metal contact for Schottky metal diode 88. The stacked structure 86 also includes a strip of antiferromagnetic material 90 which remains from the antiferromagnetic material 76. The strip of antiferromagnetic material 90 pins the magnetic orientations M2 of the magnetic storage cells 42 and 48 in a direction parallel to the length of the conductor 22.

The stacked structure 86 includes a strip of magnetic film 92, a strip of dielectric material 94, and a strip of magnetic film 96, which remain from the magnetic film 78, the dielectric material 80, and the magnetic film 82, respectively. The strips of magnetic film 92, dielectric material 94, and the magnetic film 96 are to be formed into the magnetic storage cells 40–48 with subsequent patterning steps.

Figure 4C:
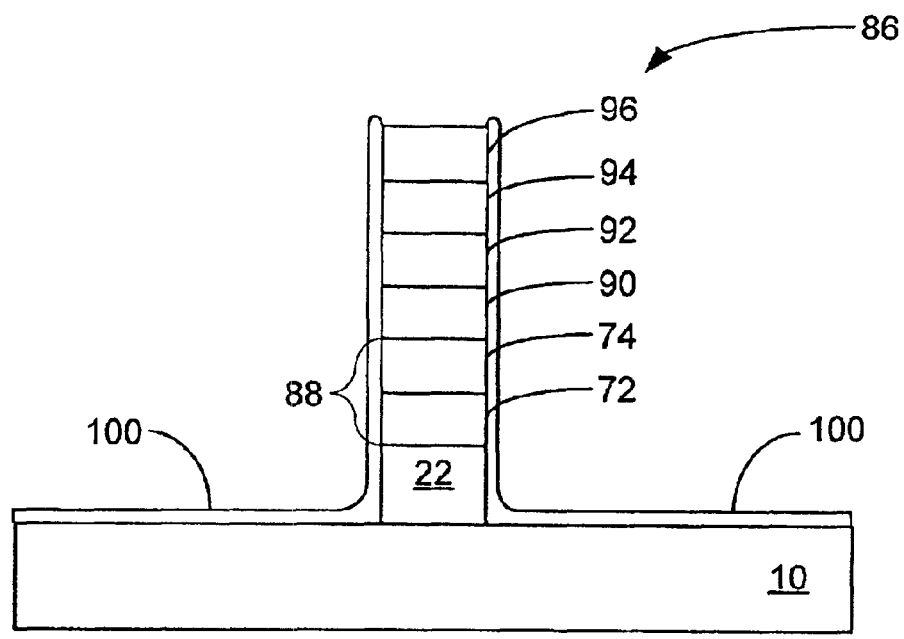
FIG. 4c is a cross-sectional view AA that shows a thin layer of protective dielectric that covers the sides of the patterned stacked structures and the exposed area of the substrate.

FIG. 4c is a cross-sectional view AA that shows a thin layer of protective dielectric 100 that covers the sides of the stacked structure 86 and the exposed area of the substrate 10. The protective dielectric 100 is initially deposited over the stacked structure 86, and the photo-resist 84 and exposed areas of the substrate 10 as a thin layer, for example 500 Angstroms (Å) or less, of dielectric material. The photo-resist 84 and other lines of photo-resist used for patterning the conductors 20–24 are then removed using for example an ultrasonic agitator with a solvent. The resulting protective dielectric 100 prevents short circuits between edges of the magnetic films 92 and 96 after the conductors 26 and 28 are formed.

Figure 4D:
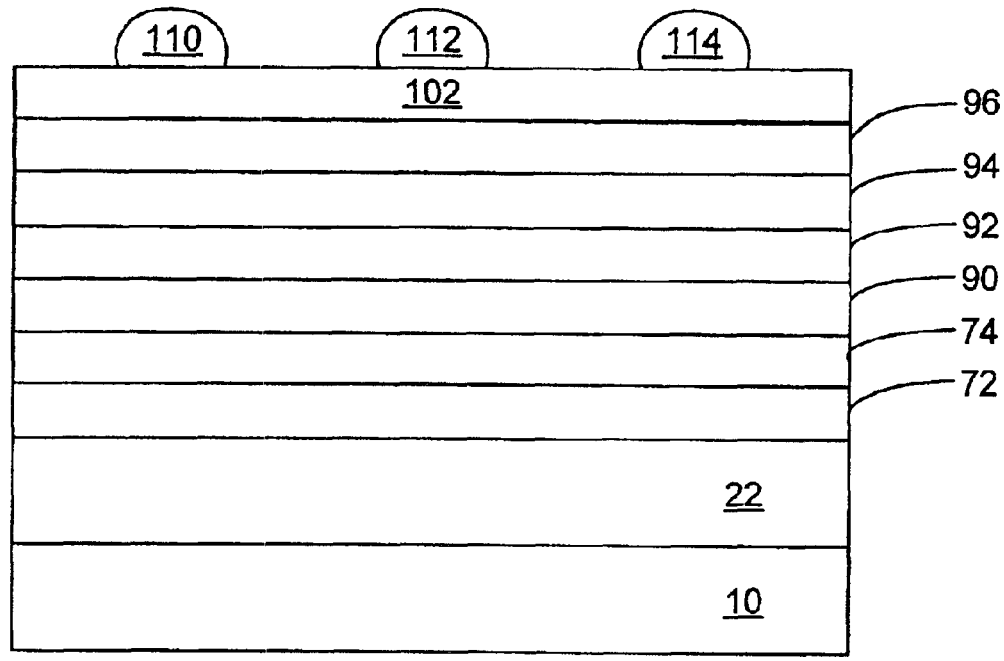
FIG. 4d is a cross-sectional view BB that shows a conductor material and top conductor photo-resist deposited over the stacked structures and the protective dielectric.

FIG. 4d is a cross-sectional view BB that shows a conductor material 102 deposited over the stacked structure 86 and the protective dielectric 100. The conductor material 102 provides a layer of conductive material for the formation of the top conductors 26–28. The conductor material 102 is a sheet of conductive material such as copper, aluminum, or gold, or alloys of these materials.

The top conductors 26–28 are then patterned from the conductor material 102. The patterning of the top conductors 26–28 forms the $d_y$ dimensions of the magnetic storage cells 40–50 and the top conductors 26–28 and automatically aligns the top conductors 26–28 and the layers of the magnetic storage cells 40–50. The top conductors 26–28 are patterned by forming lines of photo-resist including the lines of photo-resist 110–114 on top of the conductor material 102 using photolithography. The lines of photo-resist 110–114 each have a width $d_y$.

An ion milling step is used to remove materials not protected by the photo-resist 110–114. In one embodiment, the milling step is used to remove materials down to the strip of antiferromagnetic material 90. In another embodiment, the milling step is stopped before the strip of magnetic film 92 is removed. The photoresist 110–114 is then stripped away.

Figure 4E:
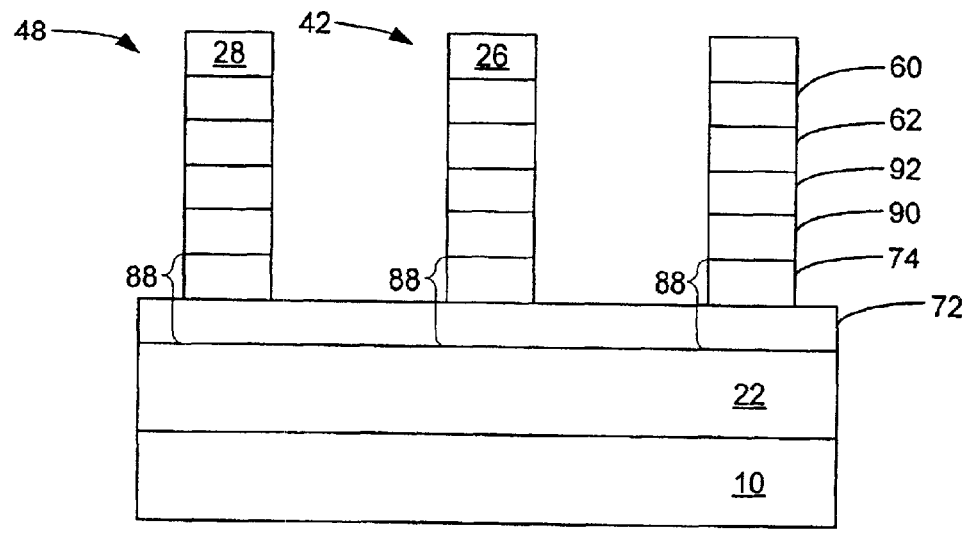
FIG. 4e is a cross-sectional view BB that shows the results of a milling step which stops before the strip of pinned magnetic film.

FIG. 4e is a cross-sectional view BB that shows the results of the milling step which stops before the removal of the magnetic film 92. Each magnetic storage cell 42–48 is shown with Schottky metal diode 88 along with the magnetic film 60 and the dielectric region 62 formed from the strip of magnetic film 96 and the strip of dielectric material 94, respectively.

The strip of magnetic material 92 provides a continuous pinned magnetic film for each magnetic storage cell 42 and 48. This embodiment prevents magnetic fields that would otherwise emanate from patterned edges of the magnetic material 92 from affecting the magnetic fields in the active magnetic films of magnetic storage cells 42 and 48.

Memory cell 42 is connected to bit line 26 and connected to an isolation diode 88 that further connects to the respective word line (bottom conductor) 22. The isolation diode 88 provides a unidirectional conductive path from the bit line 26 to the word line 22, wherein the word line 22 provides a common metal-semiconductor contact 72, 22 with each diode 88 sharing the word line 22. Each diode 88 has a separate metal contact 74 located between the semiconductor portion 72 of the common metal-semiconductor contact 72, 22 and its respective memory cell 42.

The patterning of the top conductors 26 and 28 patterns and automatically aligns the active magnetic films in the magnetic storage cells 42 and 48 to provide the aligned $d_x$ and $d_y$ dimensions. As a consequence, there is no need to use separate pattern masks for the conductors 26–28 and the active layers or dielectric layers of the magnetic storage cells 42 and 48 nor to precisely align any such pattern masks.

The structure shown in FIG. 4e may subsequently be planarized, using for example an insulating dielectric layer, and another array of magnetic storage cells formed on top of the magnetic storage cells 40–50. This is possible because no crystalline semiconductor substrate is required. The ability to have many layers of magnetic storage cells enhances the overall density that can be attained in the solid-state memory 130.

Of note, the process as described yields memory cells whose size is restricted to the dimensions of the top/bottom conductor widths, $d_x$ and $d_y$, and is presented to illustrate but one manufacturing process possible. In alternative embodiments, it is desirable to form memory cells with dimensions smaller than the conductor widths. To achieve this, separate masking/patterning steps are involved and are well-known to those skilled in the art.

Figure 5:
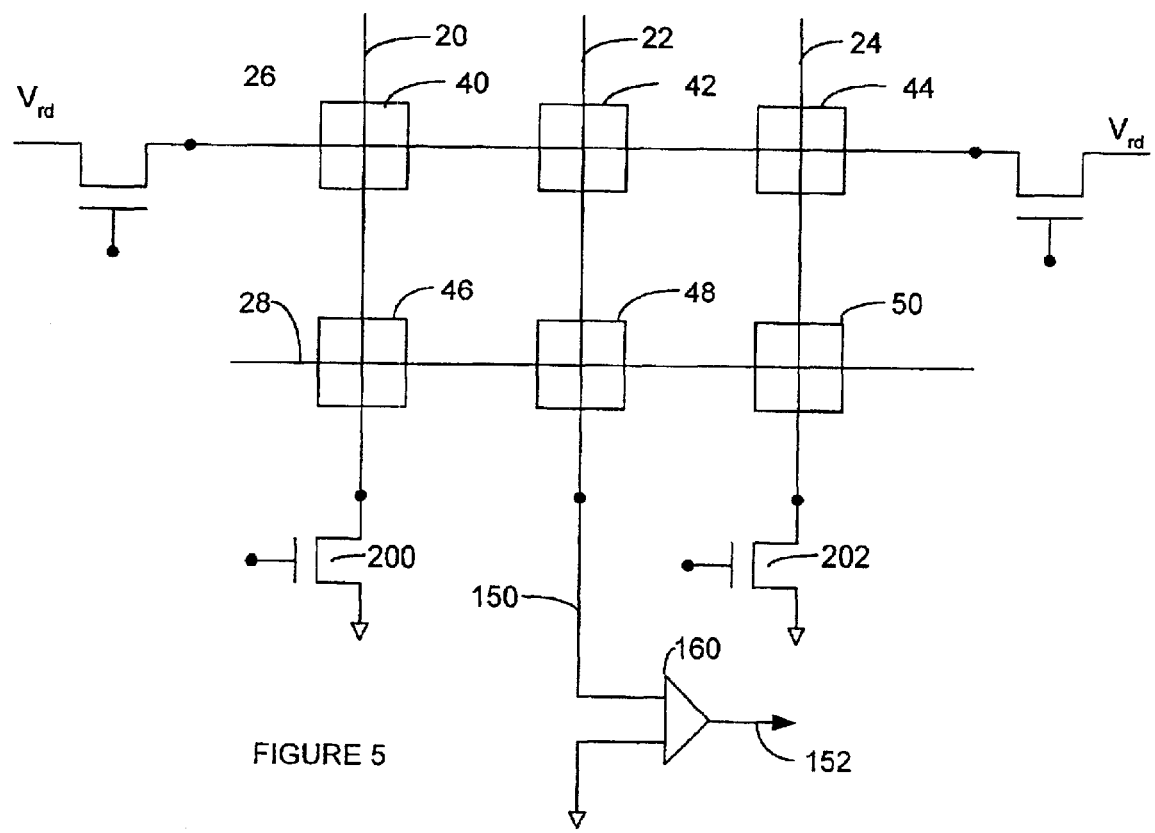
FIG. 5 shows an arrangement for reading a magnetic storage cell.

FIG. 5 shows an arrangement for reading the magnetic storage cell 42. The read circuit is coupled to one or more groups of memory cells by a respective bit line and is operable to sense current flow through a memory cell. The magnetic storage cell 42 is read by applying a read voltage $V_{rd}$ to the conductor 26 and coupling the conductor 22 to an input 150 of a current sense amplifier 160. The potential $V_{rd}$ across the magnetic storage cell 42 causes a sense current to flow into the input 150 of the current sense amplifier 160. The magnitude of the sense current indicates the resistance of the magnetic storage cell 42 and therefore its logic state.

During the read operation, the conductors 20 and 24 are applied with a ground potential using a pair of transistors 200–202. In addition, the input 150 of the current sense amplifier 160 has a virtual ground potential, which means that the conductor 22 has a virtual ground potential. The ground and virtual ground potentials of the conductors 20–24 reduce the amount of current flow between the conductors 20–24. This current flow is known as leakage current. The reduced amount of leakage current in the conductors 20–24 increases the signal to noise ratio during read operations on the magnetic storage cell 42.

The equalized potentials among the conductors 20–24 can be accomplished using a variety of circuits. A leakage current diverting means may be included which comprises an equipotential generator coupled to the word lines and operable to set voltage levels in the resistive crosspoint memory cell array to substantially prevent parasitic currents from flowing to cells other than the selected memory cells. For example, the transistors 200–202 may apply a potential $V_x$ to the conductors 20 and 24 and the input 150 may have a potential of $V_x$. In addition, each of the conductors may be coupled to an input of a corresponding differential current sense amplifier. The inputs of the current sense amplifiers may be virtual grounds or may have some other potential so long as the potentials of all the conductors 20–24 are equalized. Moreover, any combination of transistors and current sense amplifiers may be used to equalize the potentials of the conductors 20–24 during read operations. The differential current sense amplifier is operable to compare current flowing through a selected memory cell with current flowing through one or more reference cells. This operation may be accomplished by comparator circuits, each coupled to an associated read circuit and operable to convert an analog differential sense signal to a digital output read signal.

Furthermore, unselected word lines in a selected group of word lines may be connected together to set an averaged voltage that is approximately equal to an applied array voltage. The equipotential generator may be operable to establish equipotential isolation of a selected bit line based upon feedback from one or more unselected word lines. The input node of each isolation diode may be coupled to a respective voltage follower transistor and the equipotential generator may be coupled to gates of the voltage follower transistors.

In another embodiment, the read circuits include a current mirror having an operational amplifier circuit having a first input coupled to a reference voltage, a second input coupled to the selected bit lines, and an output coupled to the gates of current mirror transistors. The current mirror transistor may transport the sense signal to the current sense amplifier. The second input of the operational amplifier circuit may be coupled to the selected bit lines through a switching circuit.

The memory cells 40–50 may include thin film memory elements such as polymer memory elements, magnetic tunnel junctions (the SDT junction is a type of magnetic tunnel junction), or phase change devices. In general, the memory cells 40–50 may include any elements that store or generate information by affecting the magnitude of the nominal resistance of the elements. Such other types of elements include poly-silicon resistors as part of read-only memory, and phase change device that could be programmed to change state from crystalline to amorphous and vice versa. The device has low resistances at crystalline state and high resistance at amorphous state. Memory cell element 40 is shown in further detail in FIG. 3. Memory cells 40–50 further includes a resistive magnetic element Rm and a unidirectional conducting gate or diode 88, which is utilized to limit leakage current during the read operation as well as to provide a one-way current path from the bit lines 20–24 to word lines 26–30. The diode 88 is coupled to the resistive magnetic element Rm to provide a unidirectional conductive path from the bit line 20–24 to the word line 26–30.

The use of a large common metal-Si contact area improves the contact resistance at the common cathode. This improves the current density capacity of each diode 88. Since each diode 88 has a separate Pt contact with its associated MRAM cell, each diode 88 is separate from one another. Further, pattering is simplified since a row or column of diodes shares the common metal-Si contact. Further, the common metal-Si contact reduces, if not eliminates, current sneak paths or leakage current associated with diodes fabricated using techniques of the prior art.

The information storage device according to the present invention may be used in a wide variety of applications. For example, the information storage device may be used for long-term data storage in a computer. Such a device offers many advantages over conventional long-term data storage devices such as hard drives. Accessing data from MRAM cells is orders of magnitude faster than accessing data from hard drives. In addition, the information storage device according to the present invention is more compact than hard drives.

The information storage device according to the present invention may be used in digital cameras for long-term storage of digital images. If the calibration is accurate and the preamplifier offsets can be equalized, the information storage device may even replace DRAM and other fast, short-term memory in computers. The present invention is not limited to the specific embodiments described and illustrated above. Instead, the present invention is construed according to the claims that follow.

It is to be understood that the above-referenced arrangements are only illustrative of the application for the principles of the present invention. Numerous modifications and alternative arrangements can be devised without departing from the spirit and scope of the present invention while the present invention has been shown in the drawings and fully described above with particularity and detail in connection with what is presently deemed to be the most practical and preferred embodiments(s) of the invention, it will be apparent to those of ordinary skill in the art that numerous modifications can be made without departing from the principles and concepts of the invention as set forth in the claims.

What is claimed is:

1. A data storage device, comprising:
   a plurality of word lines;
   a plurality of bit lines; and
   a resistive crosspoint array of memory cells, each memory cell being connected to a bit line and connected to an isolation diode that further connects to a respective word line, the isolation diode providing a unidirectional conductive path from the bit line to the word line and wherein each word line provides a common metal-semiconductor contact with each diode sharing the word line such that each diode has a separate metal contact located between the semiconductor portion of the common metal-semiconductor contact and its respective memory cell.

2. The data storage device of claim 1, further comprising multiple read circuits each coupled to one or more groups of memory cells by a respective bit line and operable to sense current flow through a memory cell of the associated groups.

3. The data storage device of claim 2, wherein each read circuit comprises a differential current sense amplifier.

4. The data storage device of claim 3, wherein the differential current sense amplifier is operable to compare current flowing through a selected memory cell with current flowing through one or more reference cells.

5. The data storage device of claim 3, further comprising multiple comparator circuits each coupled to an associated read circuit and operable to convert an analog differential sense signal to a digital output read signal.

6. The data storage device of claim 3, further comprising a current mirror having an operational amplifier circuit having a first input coupled to a reference voltage, a second input coupled to the selected bit lines, and an output coupled to the gates of current mirror transistors.

7. The data storage device according to claim 6 wherein the current mirror transistor transports the sense signal to the current sense amplifier.

8. The data storage device of claim 6, wherein the second input of the operational amplifier circuit is coupled to the selected bit lines through a switching circuit.

9. The data storage device of claim 1, wherein the leakage current diverting means comprises an equipotential generator coupled to the word lines and operable to set voltage levels in the resistive crosspoint memory cell array to substantially prevent parasitic currents from flowing to the selected memory cells.

10. The data storage device of claim 9, wherein unselected word lines in a selected group of word lines are connected together to set an averaged voltage that is approximately equal to an applied array voltage.

11. The data storage device of claim 10, wherein the equipotential generator is operable to establish equipotential isolation of a selected bit line based upon feedback from one or more unselected word lines.

12. The data storage device of claim 10, wherein the input node of each isolation diode is coupled to a respective voltage follower transistor and the equipotential generator is coupled to gates of the voltage follower transistors.

13. The data storage device of claim 1, wherein each memory cell comprises a magnetic random access memory element.

14. The data storage device of claim 1, wherein the isolation diode is a metal semiconductor diode.

15. The data storage device of claim 14, wherein the isolation diode is a Schottky-metal semiconductor diode.

16. The data storage device of claim 15, wherein the Schottky-metal semiconductor diode is a Schottky Pt-Si diode.

17. The data storage device of claim 1, wherein the semiconductor portion of the common metal-semiconductor contact comprises a semiconductor layer in common with each diode sharing the word line.

18. A data storage device, comprising:

a plurality of word lines;

a plurality of bit lines; and an array of magnetic random access memory cells, each memory cell being connected to a bit line and connected to a Schottky metal semiconductor diode, the diode further connecting to a respective word line to provide a unidirectional conductive path from the bit line to the word line.

19. The data storage device of claim 17, wherein each word line provides a common metal-semiconductor contact with each Schottky metal semiconductor diode sharing the word line, such that each diode has a separate metal contact located between a semiconductor portion of the common metal-semiconductor contact and its respective memory cell.

20. The data storage device of claim 19, wherein the semiconductor portion of the common metal-semiconductor contact comprises a semiconductor layer in common with each Schottky metal semiconductor diode sharing the word line.

* * * * *